United States Patent
Fujii et al.

[11] Patent Number: 6,104,233
[45] Date of Patent: Aug. 15, 2000

[54] SUBSTRATE STRUCTURE OF SEMICONDUCTOR DEVICE

[75] Inventors: Syuso Fujii, Kanagawa-ken; Mitsuru Shimizu, Sakura; Kiyofumi Sakurai, Kawasaki, all of Japan

[73] Assignee: Kabushiki Kaisha Toshiba, Kawasaki, Japan

[21] Appl. No.: 08/180,770

[22] Filed: Jan. 10, 1994

Related U.S. Application Data

[63] Continuation of application No. 07/793,421, Dec. 13, 1991, abandoned.

[30] Foreign Application Priority Data

Apr. 13, 1990 [JP] Japan ........................................ 2-96513
Apr. 13, 1990 [JP] Japan ........................................ 2-96514
Apr. 12, 1991 [WO] WIPO ........................ PCT/JP91/00482

[51] Int. Cl.⁷ .................................................. H01L 25/00
[52] U.S. Cl. .............................. 327/534; 327/56; 327/55; 327/67
[58] Field of Search ........................ 357/23.4; 307/296.2, 307/530, 572, 575, 576, 577, 579, 303, 303.1; 257/369, 371; 327/51, 55, 56, 67, 437, 534, 564, 565, 566

[56] References Cited

U.S. PATENT DOCUMENTS

| | | | |
|---|---|---|---|
| 4,233,672 | 11/1980 | Suzuki et al. | 307/530 |
| 4,373,253 | 2/1983 | Khadder et al. | 257/369 |
| 4,608,584 | 8/1986 | Mihara | 357/23.4 |
| 4,694,313 | 9/1987 | Beasom | 357/23.4 |
| 4,879,584 | 11/1989 | Takagi et al. | 257/370 |
| 4,901,127 | 2/1990 | Chow et al. | 357/23.4 |
| 4,937,647 | 6/1990 | Sutten | 357/43 |
| 4,941,027 | 7/1990 | Beasom | 357/23.12 |
| 4,980,746 | 12/1990 | Harrington, III | 257/369 |
| 5,045,716 | 9/1991 | Takacs et al. | 257/369 |
| 5,159,426 | 10/1992 | Harrington, III | 257/369 |

FOREIGN PATENT DOCUMENTS

| | | |
|---|---|---|
| 2 303 382 | 1/1981 | European Pat. Off. . |
| 0 062 894 | 10/1982 | European Pat. Off. . |
| 0 040 125 | 11/1986 | European Pat. Off. . |
| 0 245 515 | 11/1987 | European Pat. Off. . |
| 0 329 100 | 8/1989 | European Pat. Off. . |
| 0 261 556 | 3/1988 | France . |
| 48-39875 | of 0000 | Japan . |
| 57-133731 | of 0000 | Japan . |
| 0141965 | 9/1982 | Japan .................................... 357/23.4 |
| 61-093657 | 9/1986 | Japan . |
| 62-066656 | 3/1987 | Japan . |
| 62-125659 | 6/1987 | Japan . |
| 87/03423 | 6/1987 | WIPO . |

OTHER PUBLICATIONS

Patent Abstracts of Japan, vol. 11, No. 346 (Nov. 12,1987).
Patent Abstracts of Japan, vol. 11, No. 257 (Aug. 20, 1987).
Patent Abstracts of Japan, vol. 10, No. 272 (Sep. 16, 1986).
Weste et al., "Principles of CMOS VLSI Design", Addison Wesley Publishing Comp., pp. 207–212.

*Primary Examiner*—Terry D. Cunningham
*Attorney, Agent, or Firm*—Banner & Witcoff, Ltd.

[57] ABSTRACT

A p-well region (16) is formed in the main surface area of an n-type semiconductor substrate (11). A potential ($V_{BB}$) which is lower than an externally input potential is applied to the p-well region (16). In the surface area of the p-well region (16), a first impurity diffused layer (12) of n-type to which the externally input potential (Vin) is applied and a second impurity diffused layer (13) of n-type to which a reference potential is applied are formed. The first impurity diffused layer (12) serves as the drain region of a first MOS transistor (Q9) of n-channel formed in the p-well region (16) and the second impurity diffused layer (13) serves as the drain region of a second MOS transistor (Q10) of n-channel which is also formed in the p-well region (16). The first and second MOS transistors (Q9 and Q10) constitute the input section of an input circuit. The input circuit detects the level of the externally input potential (Vin) by comparing the externally input potential (Vin) with the reference potential (Vref).

23 Claims, 4 Drawing Sheets

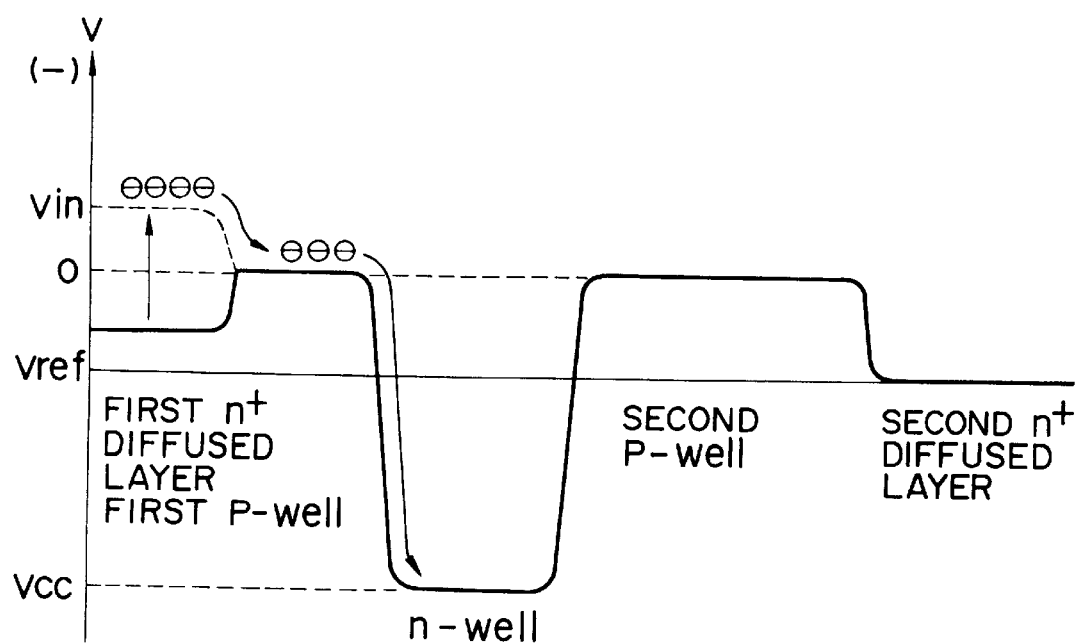
F I G. 7

SUBSTRATE STRUCTURE OF SEMI-CONDUCTOR DEVICE

This application is a continuation of application Ser. No. 07/793,421, filed Dec. 13, 1991, now abandoned.

TECHNICAL FIELD

This invention relates to a substrate structure of a semiconductor device, and more particularly to the structure of a substrate portion in which an input circuit of a semiconductor memory device is formed.

BACKGROUND ART

In a semiconductor memory device, input circuits such as a data-in buffer circuit and an address buffer circuit are provided. An address pin is connected to the input node of the address buffer circuit and a data pin is connected to the input node of the data-in buffer circuit, and an address and data are input to them. These input circuits detect the "High" or "Low" or "1" or "0" of data by comparing an externally input voltage (which is hereinafter simply referred to as Vin) which is data of TTL level with a reference potential (which is hereinafter simply referred to as Vref) and amplifies and converts the detected signal to a signal of MOS level used inside the memory device.

FIG. 1 is an equivalent circuit diagram of the above address buffer circuit. The address buffer circuit is constructed to include p-channel MOS transistors Q1 and Q2, n-channel MOS transistors Q3 to Q10, and MOS capacitors C1 and C2. The operation of the circuit is controlled by internal control signals $\phi 1$, $\phi 2$ and $\phi 3$ which are created based on a control signal (CAS, RAS or the like in a DRAM) input from the exterior and the circuit responds to the internal control signals at respective timings to latch the input address. Then, whether Vin is "High" or "Low" is detected according to whether the potential of Vin is higher than Vref or not and it is output as address signals Aout and $\overline{\text{Aout}}$.

Vref is a potential used as a reference in the circuit operation of the semiconductor memory device and is created in the memory device. Vref is normally set at a positive potential and it is particularly important in the circuit operation to prevent variation in the potential.

In a semiconductor memory device having the above-described input circuit, a test for checking the operation characteristic of the semiconductor memory device is effected by adding a negative potential (for example, approximately −2.0 V) to Vin, but in this test, the following problems occur.

The problem is explained with reference to FIG. 2. FIG. 2 provides a view of the structural arrangement of a portion of a semiconductor memory device in which the n-channel MOS transistors Q3 to Q10 and MOS capacitors C1 and C2 of the address buffer circuit shown in FIG. 1 are formed.

A p-well region 26 is formed in the main surface area of an n-type semiconductor substrate 21. $n^+$-type impurity diffused layers 22 and 23 and a $p^+$-type impurity diffused layer 28 are separately formed in the surface area of the p-well region 26. The impurity diffused layer 22 serves as a drain region of the MOS transistor Q9 and Vin is applied to the diffused layer 22 via a wiring 24. The impurity diffused layer 23 serves as a drain region of the MOS transistor Q10 and Vref is applied to the diffused layer 23 via a wiring 25. A ground potential (which is hereinafter simply referred to as Vss) is applied to the impurity diffused layer 28 via a wiring 27. As a result, the ground potential is applied to the p-well region 26.

Although not shown in the drawing, the source regions of the n-channel MOS transistors Q9 and Q10, the source and drain regions of the n-channel MOS transistors Q3 to Q8, the MOS capacitors C1 and C2 and the like are formed in the p-well region 26. The p-channel MOS transistors Q1 and Q2 are formed in the main surface area of the substrate 21.

With the above substrate structure, when a function test is effected by applying a negative potential to the above-described input pin, in other words, when Vin is a negative potential, minority carriers are generated in a junction between the impurity diffused layer 22 and the p-well region 26. As shown by the potential energy diagram in FIG. 3, part of the minority carriers flows into the n-type semiconductor substrate 21 but the remaining minority carriers which have lost their way flow into the impurity diffused layer 23 so that Vref may be lowered. Since Vref is a potential used as a reference in the circuit operation, the semiconductor memory device may be erroneously operated if the potential has varied.

Thus, in the semiconductor device formed in the n-type semiconductor substrate, an erroneous operation caused by variation in the substrate potential due to injection of the minority carriers develops into a serious problem.

Accordingly, an object of this invention is to provide the substrate structure of a semiconductor device capable of eliminating the above-described conventional defects and enhancing the reliability.

DISCLOSURE OF INVENTION

The substrate structure of a first semiconductor device according to this invention comprises a semiconductor substrate of first conductivity type, a well region of second conductivity type formed in the semiconductor substrate and applied with a potential lower than an externally input potential, a first impurity diffused layer of the first conductivity type formed in the well region and applied with the externally input potential, and a second impurity diffused layer of the first conductivity type formed in the well region and applied with a reference potential.

With the above substrate structure, the first and second impurity diffused layers are formed in the well region and the well region is applied with a potential (whose absolute value is larger than that of Vin) lower than Vin. Therefore, minority carriers generated when a negative potential is applied as Vin will not move to the well region whose energy potential is high and consequently they will not move into the second impurity diffused layer so that Vref will not be varied.

The substrate structure of a second semiconductor device according to this invention comprises a semiconductor substrate of first conductivity type, a first well region of second conductivity type formed in the semiconductor substrate and applied with a potential, a first impurity diffused layer of the first conductivity type formed in the first well region and applied with an externally input potential, a second well region of the second conductivity type formed in the semiconductor substrate and applied with the above-mentioned potential, a second impurity diffused layer of the first conductivity type formed in the second well region and applied with a reference potential, and a third well region of the first conductivity type formed in that portion of the semiconductor substrate which lies between the first and second well regions and applied with a potential higher than the first and second potentials.

With the above substrate structure, since the third well region whose potential energy is lower than those of the first and second well regions is formed between the first and second well regions, minority carriers generated from the first well region are absorbed into the third well region and will not reach the second well region. Therefore, the minority carriers will not reach the second impurity diffused layer formed in the second well region and Vref will not be varied.

The substrate structure of a third semiconductor device according to this invention comprises a semiconductor substrate of first conductivity type, a first well region of second conductivity type formed in the semiconductor substrate and applied with a ground potential, a first impurity diffused layer of the first conductivity type formed in the first well region and applied with an externally input potential, a second well region of the second conductivity type formed in the semiconductor substrate and applied with the ground potential, a second impurity diffused layer of the first conductivity type formed in the second well region and applied with a reference potential, and a third well region of the first conductivity type formed in that portion of the semiconductor substrate which lies between the first and second well regions and applied with a power source potential.

With the above substrate structure, the ground potential is used as the first and second potentials in the substrate structure of the above-described second semiconductor device according to this invention and the power source potential is applied to the third well region. That is, since the power source potential is higher than the ground potential (the potential energy is lower), minority carriers generated in the first well region are absorbed into the third well region and will not reach the second well region. In this case, the power source potential is normally set at a positive potential and includes a potential obtained by lowering the power source voltage of the semiconductor device having a power source voltage drop circuit.

BRIEF DESCRIPTION OF DRAWINGS

FIG. 7 is a diagram showing the potential energy of the substrate structure shown in FIG. 6.

BEST MODE OF CARRYING OUT THE INVENTION

This invention will be explained in more detail with reference to the accompanying drawings.

Figure 1:
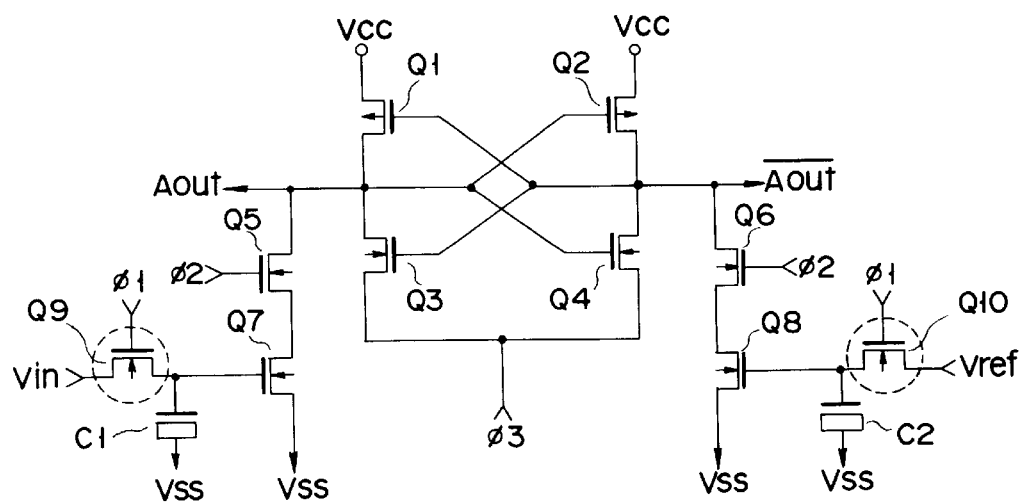
FIG. 1 is an equivalent circuit diagram of an address buffer circuit.
Figure 2:
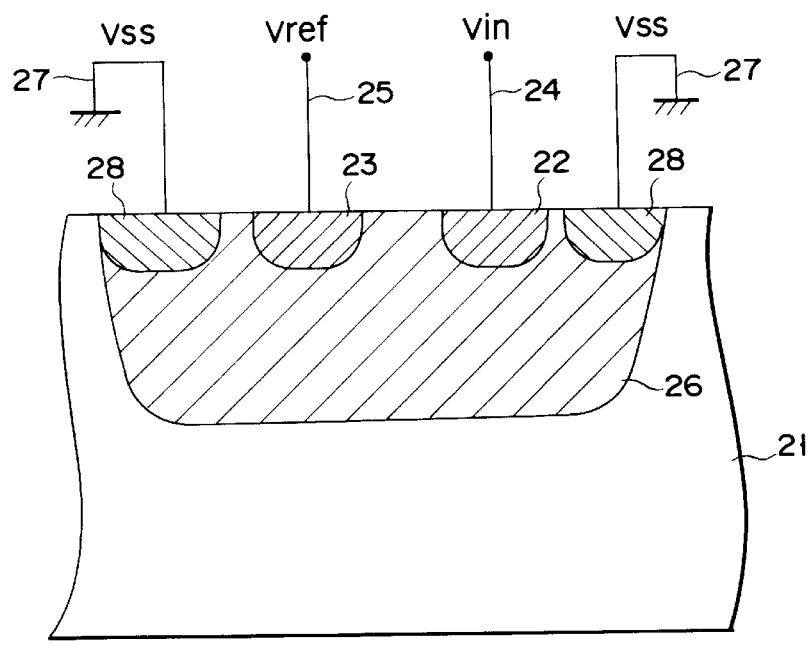
FIG. 2 provides a view of the structural arrangement of a conventional semiconductor device.
Figure 3:
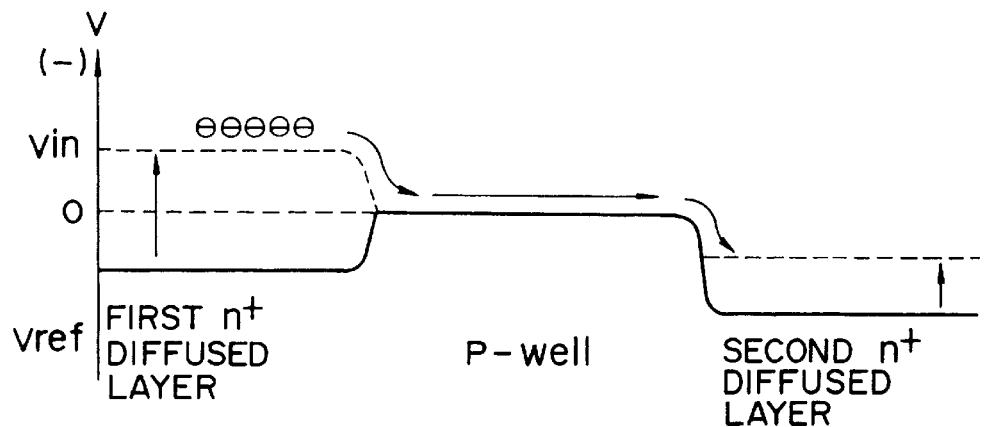
FIG. 3 is a diagram showing the potential energy in the substrate structure shown in FIG. 2, FIG. 4 provides a view of the structural arrangement of a semiconductor device according to a first embodiment of this invention.
Figure 4:
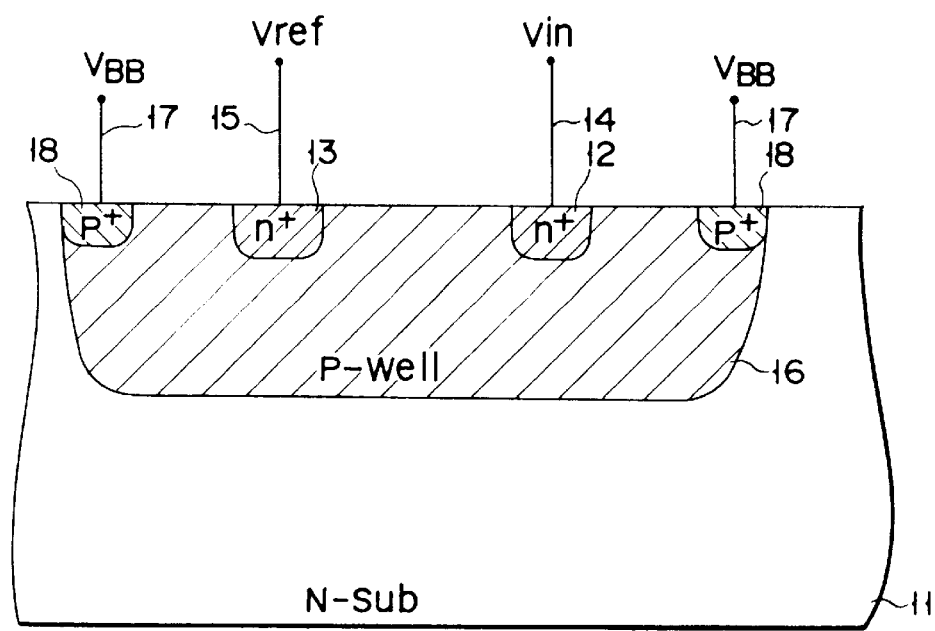

FIG. 4 provides a view of the structural arrangement of a semiconductor device according to a first embodiment of this invention. In the substrate structure, for example, input circuits such as the data-in buffer circuit and address buffer circuit shown in FIG. 1 are formed. In the following description, a case wherein the address buffer circuit shown in FIG. 1 is formed is explained.

A p-well region 16 is formed in the main surface area of an n-type semiconductor substrate 11. In the surface area of the p-well region 16, $n^+$-type impurity diffused layers 12 and 13 and $p^+$-type impurity diffused layer 18 are separately formed. The impurity diffused layer 12 serves as the drain region of the MOS transistor Q9 in the circuit shown in FIG. 1 and Vin is applied to the diffused layer 12 via a wiring 14. The impurity diffused layer 13 serves as the drain region of the MOS transistor Q10 in the circuit shown in FIG. 1 and Vref is applied to the diffused layer 13 via a wiring 15. A reference potential (which is hereinafter referred to as $V_{BB}$) of the semiconductor substrate 11 is applied to the impurity diffused layer 18 via a wiring 17. As a result, $V_{BB}$ is applied to the well region 16.

Although not shown in the drawing, the source regions of the n-channel MOS transistors Q9 and Q10, the source and drain regions of the n-channel MOS transistors Q3 to Q8, MOS capacitors C1 and C2 and the like are formed in the p-well region 26. The source and drain regions of the MOS transistors Q3 to Q8 and the MOS capacitors C1 and C2 may be formed in a p-well region which is formed in position separated from the p-well region 16. The important thing is to form the source and drain regions of the MOS transistors Q9 and Q10 surrounded by broken lines in FIG. 1 in the p-well region 16. p-channel MOS transistors Q1 and Q2 are formed in the main surface area of the substrate 1.

Figure 5:
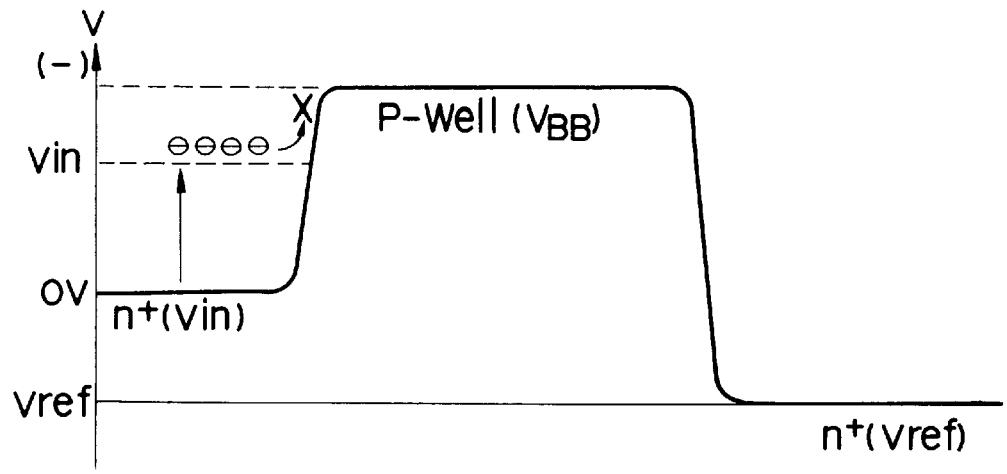
FIG. 5 is a diagram showing the potential energy of the substrate structure shown in FIG. 4, FIG. 6 provides a view of the structural arrangement of a semiconductor device according to a second embodiment of this invention.

With the above substrate structure, since the potential applied to the p-well region 16 is changed from Vss (ground potential) set in the prior art case to $V_{BB}$ (for example, approx. −3.0 V) as shown in the potential energy diagram of FIG. 5, generated minority carriers will not move into the diffused layer 13 if Vin is kept higher than $V_{BB}$ (but having a magnitude wherein $|Vin|<|V_{BB}|$) even if Vin is a negative potential, so that the potential of Vref will not be lowered by the minority carriers.

Therefore, an error in the operation of the input circuit caused by reduction in Vref due to the injection of the minority carriers into the diffused layer 13 can be prevented.

Figure 6:
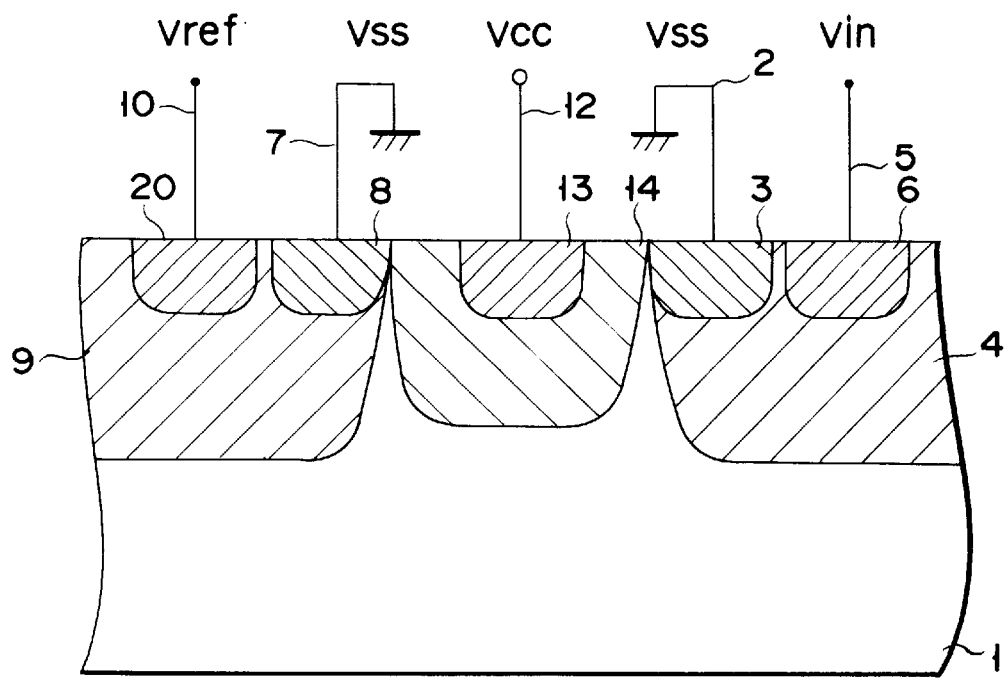

FIG. 6 provides a view of the structural arrangement of the semiconductor device according to a second embodiment of this invention. In the substrate structure, for example, input circuits such as a data-in buffer circuit and an address buffer circuit shown in FIG. 1 are formed. In the following description, a case wherein the address buffer circuit shown in FIG. 1 is formed like the first embodiment is explained.

In the main surface area of an n-type semiconductor substrate 1, a first p-well region 4 and a second p-well region 9 are separately formed. Further, an n-well region 14 is formed in that portion of the substrate 1 which lies between the first and second p-well regions 4 and 9. In the surface area of the well region 4, a $p^+$-type impurity diffused layer 3 and an $n^+$-type impurity diffused layer 6 are separately formed. Vss is applied to the impurity diffused layer 3 via a wiring 2 so that Vss can be applied to the well region 4. The impurity diffused layer 6 serves as the drain region of the MOS transistor Q9 in the circuit of FIG. 1 and Vin (externally input potential) is applied to the diffused layer 6 via a wiring 5. In the surface area of the well region 9, a $p^+$-type impurity diffused layer 8 and an $n^+$-type impurity diffused layer 20 are separately formed. Vss is applied to the impurity diffused layer 8 via a wiring 7 so that Vss can be applied to the well region 9. The impurity diffused layer 20 serves as the drain region of the MOS transistor Q10 in the circuit of FIG. 1 and Vref is applied to the diffused layer 20 via a wiring 10. Further, in the surface area of the well region 14, an n⁺-type impurity diffused layer 13 is formed and a power source potential (Vcc>0) is applied to the diffused layer 13 via a wiring 12.

Although not shown in the drawing, the source region of the n-channel MOS transistor Q9 is formed in the first p-well region 4 and the source region of the n-channel MOS transistor Q10 is formed in the second p-well region 9. The source and drain regions of the n-channel MOS transistors Q3 to Q8, MOS capacitors C1 and C2 and the like may be formed in the well region 9 or may be formed in a third p-well region which is formed in position separated from the first and second well regions 4 and 9. Further, the source and drain regions of the MOS transistors Q3, Q5, Q7 and Q9 and the MOS capacitor C1 may be formed in the first well region 4 and the source and drain regions of the MOS transistors Q4, Q6, Q8 and Q10 and the MOS capacitor C2 may be formed in the second well region 9. The important thing is to form the source and drain regions of the MOS transistor Q9 surrounded by broken lines in the first p-well region 4 and form the source and drain regions of the MOS transistor Q10 surrounded by broken lines in the second p-well region 9. p-channel MOS transistors Q1 and Q2 are formed in the main surface area of the substrate 1.

With the above substrate structure, as shown in the potential energy diagram of FIG. 7, most of minority carriers generated in a junction portion between the diffused layer 6 and the first p-well region 4 when a negative potential is applied to Vin flow into the n-well region 14 which has a low energy potential. The second p-well region 9 having a high energy potential is disposed before the n-well region 14, and electrons which are minority carriers will not climb over the energy potential wall and are all collected by Vcc which is a potential of the n-well region 14. Therefore, the minority carriers will not move into the second well region 9 having the diffused layer 20 formed therein and connected to Vref.

Thus, an error in the operation of the semiconductor device (in this example, which is the address circuit) caused by reduction in Vref due to the injection of the minority carriers can be prevented.

Further, in the above-described second embodiment, the first p-well region 4, second p-well region 9 and n-well region 14 are formed in contact with each other, but they are not limited to this configuration and they may be disposed with a preset distance to attain the same effect. Further, Vss is applied to the first p-well region 4 and second p-well region 9, but a substrate potential (for example, approximately −3.0 V) of the semiconductor substrate 1 may be applied thereto to attain the same effect.

INDUSTRIAL APPLICABILITY

As described above, in the substrate structure of the semiconductor device according to this invention, an error in the operation of the semiconductor device due to variation in the reference potential caused by the minority carriers generated when a negative potential is applied as an externally input potential can be effectively prevented. Therefore, it is effective to enhance the reliability of the semiconductor device.

What is claimed is:

1. A method of testing an input circuit, for a semiconductor device, that detects a level of an input signal $V_{in}$ by comparing the input signal $V_{in}$ with a reference signal $V_{ref}$, said input circuit comprising a semiconductor material of a first conductivity type, a first region of a second conductivity type opposite the first conductivity type in a surface portion of said semiconductor material, a second region of the first conductivity type in said first region, and a third region of the first conductivity type in said first region, said method comprising the steps of:

applying the input signal $V_{in}$ to said second region, wherein $V_{in}$ is negative;

applying the reference signal $V_{ref}$ to said third region; and applying to said first region a potential which is lower and has a greater magnitude than the potential of the input signal $V_{in}$ thereby preventing an injection of carriers generated at a junction between said first and second regions into said third region.

2. The method according to claim 1, wherein said step of applying the potential which is lower and has a greater magnitude than the potential of the input signal $V_{in}$ comprises:

applying the potential which is lower and has a greater magnitude than the potential of the input signal $V_{in}$ to a fourth region of the second conductivity type in said first region.

3. A method of testing an address buffer circuit, for a semiconductor device, that detects a level of an input signal $V_{in}$ by comparing the input signal $V_{in}$ with a reference signal $V_{ref}$, said address buffer circuit comprising a semiconductor material of a first conductivity type, a first region of a second conductivity type opposite the first conductivity type in a surface portion of said semiconductor material, a second region of the first conductivity type in said first region, and a third region of the first conductivity type in said first region, said method comprising the steps of:

applying the input signal $V_{in}$ to said second region, wherein $V_{in}$ is negative;

applying the reference signal $V_{ref}$ to said third region; and applying to said first region a potential which is lower and has a greater magnitude than the potential of the input signal $V_{in}$ thereby preventing an injection of carriers generated at a junction between said first and second regions into said third region.

4. A method for testing an input circuit, for a semiconductor device, that detects a level of an input signal $V_{in}$ by comparing the input signal $V_{in}$ with a reference signal $V_{ref}$, said input circuit comprising a semiconductor material of a first conductivity type, a first region of a second conductivity type opposite the first conductivity type in a surface portion of said semiconductor material, a first input field effect transistor formed in said first region and including a first current terminal region of the first conductivity type, a second input field effect transistor formed in said first region and including a first current terminal region of the first conductivity type, said method comprising the steps of:

applying the input signal $V_{in}$ to the first current terminal region of said first input field effect transistor, wherein $V_{in}$ is negative;

applying the reference signal $V_{ref}$ to the first current terminal region of said second input field effect transistor; and applying to said first region a potential which is lower and has a greater magnitude than the potential of the input signal $V_{in}$ thereby preventing an injection of carriers generated at a junction between said first region and the first current terminal region of said first input field effect input transistor into the first current terminal region of said second field effect transistor.

5. The method according to claim 4, wherein said step of applying the potential which is lower and has a greater magnitude than the potential of the input signal $V_{in}$ comprises:

applying the potential which is lower and has a greater magnitude than the potential of the input signal $V_{in}$ to a fourth region of the second conductivity type in said first region.

6. A method of testing an input circuit, for a semiconductor device, that detects a level of an input signal $V_{in}$ by comparing the input signal $V_{in}$ with a reference signal $V_{ref}$, said input circuit comprising a semiconductor material of a first conductivity type, first and second spaced regions of a second conductivity type opposite the first conductivity type in a surface portion of said semiconductor material, a first input field effect transistor formed in said first region and including a first current terminal region of the first conductivity type, a second input field effect transistor formed in said second region and including a first current terminal region of the first conductivity type, a third region of the first conductivity type between said first and second spaced regions, said method comprising the steps of:

applying a first power source potential to said first region;

applying the first power source potential to said second region;

applying the reference signal $V_{ref}$ to the first current terminal of said first input field effect transistor;

applying the input signal $V_{in}$ to the first current terminal of said second input field effect transistor, wherein $V_{in}$ is negative; and applying to said third region a second power source potential higher than the first power source potential thereby preventing an injection of carriers generated at a junction between said first region and the first current terminal region of said first input field effect transistor into the first current terminal region of said second input field effect transistor.

7. The method according to claim 6, wherein said step of applying the second power source potential higher than the first power source potential comprises:

applying the second power source potential higher than the first power source potential to a fourth region of the first conductivity type in said third region.

8. The method according to claim 6, wherein said step of applying a first power source potential to said first region comprises applying a first power source potential to a region of the second conductivity type in said first region; and said step of applying a first power source potential to said second region comprises applying a first power source potential to a region of the second conductivity type in said second region.

9. The method according to claim 6, wherein the first power source potential is a ground potential.

10. The method according to claim 6, wherein said third region contacts said first and second regions.

11. A method of testing an input circuit, for a semiconductor device, that detects a level of an input signal $V_{in}$ by comparing the input signal $V_{in}$ with a reference signal $V_{ref}$, said input circuit comprising a semiconductor material of a first conductivity type, a first region of a second conductivity type opposite the first conductivity type in a surface portion of said semiconductor material, a second region of the first conductivity type in said first region, and a third region of the first conductivity type in said first region, said method comprising the steps of:

applying the input signal $V_{in}$ to said second region;

applying the reference signal $V_{ref}$ to said third region; and applying to said first region a potential which is lower and has a greater magnitude than a potential of the input signal $V_{in}$ when the potential of the input signal $V_{in}$ is negative, thereby preventing an injection of carriers generated at a junction between said first and second regions into said third region.

12. A method for testing an input circuit, for a semiconductor device, that detects a level of an input signal $V_{in}$ by comparing the input signal $V_{in}$ with a reference signal $V_{ref}$, said input circuit comprising a semiconductor material of a first conductivity type, a first region of a second conductivity type opposite the first conductivity type in a surface portion of said semiconductor material, a first input field effect transistor formed in said first region and including a first current terminal region of the first conductivity type, a second input field effect transistor formed in said first region and including a first current terminal region of the first conductivity type, said method comprising the steps of:

applying the input signal $V_{in}$ to the first current terminal region of said first input field effect transistor;

applying the reference signal $V_{ref}$ to the first current terminal region of said second input field effect transistor; and applying to said first region a potential which is lower and has a greater magnitude than a potential of the input signal $V_{in}$ when the potential of the input signal $V_{in}$ is negative, thereby preventing an injection of carriers generated at a junction between said first region and the first current terminal region of said first input field effect input transistor into the first current terminal region of said second field effect transistor.

13. A method of testing an input circuit, for a semiconductor device, that detects a level of an input signal $V_{in}$ by comparing the input signal $V_{in}$ with a reference signal $V_{ref}$, said input circuit comprising a semiconductor substrate of a first conductivity type, first and second spaced regions of a second conductivity type opposite the first conductivity type in a surface portion of said semiconductor substrate, a first input field effect transistor formed in said first region and including a first current terminal region of the first conductivity type, a second input field effect transistor formed in said second region and including a first current terminal region of the first conductivity type, a third region of the first conductivity type between said first and second spaced regions, said method comprising the steps of:

applying a first power source potential to said first region;

applying the first power source potential to said second region;

applying the reference signal $V_{ref}$ to the first current terminal of said first input field effect transistor;

applying the input signal $V_{in}$ to the first current terminal of said second input field effect transistor; and applying to said third region a second power source potential higher than the first power source potential when a potential of the input signal $V_{in}$ is negative, thereby preventing an injection of carriers generated at a junction between said first region and the first current terminal region of said first input field effect transistor into the first current terminal region of said second input field effect transistor.

14. The method according to claim 13, wherein the first power source potential is a ground potential.

15. A method of operating an input circuit in a test mode, said input circuit comprising a semiconductor substrate of a first conductivity type, a first region of a second conductivity type opposite the first conductivity type in a surface portion of said semiconductor substrate, a second region of the first conductivity type in said first region, and a third region of the first conductivity type in said first region, wherein said input circuit detects a logic level of an input signal $V_{in}$ applied to said second region by comparing the input signal $V_{in}$ with a reference signal $V_{ref}$ applied to said third region, said method comprising the steps of:

applying a negative input potential to said second region, wherein the negative input potential is generated externally of said semiconductor substrate;

applying the reference signal $V_{ref}$ to said third region; and applying to said first region a potential which is lower and has a greater magnitude than the negative input potential thereby preventing an injection of carriers generated at a junction between said first and second regions into said third region.

16. The method according to claim 15, wherein said step of applying the potential which is lower and has a greater magnitude than the negative input potential comprises:

applying the potential which is lower and has a greater magnitude than the negative input potential to a fourth region of the second conductivity type in said first region.

17. A method of operating an input circuit in a test mode, said input circuit comprising a semiconductor substrate of a first conductivity type, a first region of a second conductivity type opposite the first conductivity type in a surface portion of said semiconductor substrate, a first input field effect transistor formed in said first region and including a first current terminal region of the first conductivity type, a second input field effect transistor formed in said first region and including a first current terminal region of the first conductivity type, wherein said input circuit detects a logic level of an input signal $V_{in}$ applied to the first current terminal region of said first input field effect transistor by comparing the input signal $V_{in}$ with a reference signal $V_{ref}$ applied to the first current terminal region of said second input field effect transistor, said method comprising the steps of:

applying a negative input potential to the first current terminal region of said first input field effect transistor, wherein the negative input potential is generated externally of said semiconductor substrate;

applying the reference signal $V_{ref}$ to the first current terminal region of said second input field effect transistor; and applying to said first region a potential which is lower and has a greater magnitude than the negative input potential thereby preventing an injection of carriers generated at a junction between said first region and the first current terminal region of said first input field effect input transistor into the first current terminal region of said second field effect transistor.

18. The method according to claim 17, wherein said step of applying the potential which is lower and has a greater magnitude than the negative input potential comprises:

applying the potential which is lower and has a greater magnitude than the negative input potential to a fourth region of the second conductivity type in said first region.

19. A method of operating an input circuit in a test mode, said input circuit comprising a semiconductor substrate of a first conductivity type, first and second spaced regions of a second conductivity type opposite the first conductivity type on a surface portion of said semiconductor substrate, a first input field effect transistor formed in said first region and including a first current terminal region of the first conductivity type, a second input field effect transistor formed in said second region and including a first current terminal region of the first conductivity type, a third region of the first conductivity type formed in said semiconductor substrate and substantially occupying a space between said first and second spaced regions, wherein said input circuit detects a level of an input signal $V_{in}$ applied to the first current terminal of said second input field effect transistor by comparing the input signal $V_{in}$ with a reference signal $V_{ref}$ applied to the first current terminal of said first input field effect transistor, said method comprising the steps of:

applying a first power source potential to said first region;

applying the first power source potential to said second region;

applying the reference signal $V_{ref}$ to the first current terminal of said first input field effect transistor;

applying a negative input potential to the first current terminal of said second input field effect transistor, wherein the negative input potential is generated externally of said semiconductor substrate; and applying to said third region a second power source potential higher than the first power source potential thereby preventing an injection of carriers generated at a junction between said first region and the first current terminal region of said second input field effect transistor into the first current terminal region of said first input field effect transistor.

20. The method according to claim 19, wherein said step of applying the second power source potential higher than the first power source potential comprises:

applying the second power source potential higher than the first power source potential to a fourth region of the first conductivity type in said third region.

21. The method according to claim 19, wherein:

said step of applying a first power source potential to said first region comprises applying a first power source potential to a region of the second conductivity type in said first region; and said step of applying the first power source potential to said second region comprises applying the first power source potential to a region of the second conductivity type in said second region.

22. The method according to claim 19, wherein the first power source potential is a ground potential.

23. The method according to claim 19, wherein said third region contacts said first and second regions.

* * * * *